United States Patent
Cai (10) Patent No.: US 10,461,156 B2
(45) Date of Patent: Oct. 29, 2019

(54) **LDMOS TRANSISTOR AND METHOD OF FORMING THE LDMOS TRANSISTOR WITH IMPROVED RDS*CGD**

(71) Applicant: Texas Instruments Incorporated, Dallas, TX (US)

(72) Inventor: Jun Cai, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/244,616

(22) Filed: Aug. 23, 2016

(65) Prior Publication Data
US 2016/0365412 A1 Dec. 15, 2016

Related U.S. Application Data (63) Continuation of application No. 14/556,185, filed on Nov. 30, 2014, now Pat. No. 9,455,332.

(60) Provisional application No. 61/948,853, filed on Mar. 6, 2014.

(51) Int. Cl.
| | |
|---|---|
| H01L 29/66 | (2006.01) |
| H01L 21/336 | (2006.01) |
| H01L 29/08 | (2006.01) |
| H01L 29/78 | (2006.01) |
| H01L 29/06 | (2006.01) |
| H01L 29/10 | (2006.01) |
| H01L 21/265 | (2006.01) |

(52) U.S. Cl.
CPC ...... *H01L 29/0878* (2013.01); *H01L 29/0688* (2013.01); *H01L 29/0847* (2013.01); *H01L 29/1083* (2013.01); *H01L 29/1095* (2013.01); *H01L 29/6659* (2013.01); *H01L 29/66659* (2013.01); *H01L 29/66681* (2013.01); *H01L 29/7816* (2013.01); *H01L 29/7835* (2013.01); *H01L 21/26513* (2013.01); *H01L 21/26586* (2013.01); *H01L 29/0653* (2013.01)

(58) Field of Classification Search
CPC ..... H01L 29/78; H01L 29/0653; H01L 29/36; H01L 29/66681; H01L 29/7835; H01L 29/086; H01L 29/878; H01L 29/66659
USPC ......... 257/336, 344, 339, E29.256, E29.268; 438/286, 306
See application file for complete search history.

(56) References Cited

U.S. PATENT DOCUMENTS

| | | | |
|---|---|---|---|
| 6,168,983 B1 | 1/2001 | Rumennik et al. | |
| 2004/0201061 A1* | 10/2004 | Jeon | H01L 29/0634 257/335 |
| 2008/0093641 A1* | 4/2008 | Ludikhuize | H01L 29/0634 257/289 |
| 2008/0164537 A1 | 7/2008 | Cai | |

(Continued)

OTHER PUBLICATIONS

CNIPA (China National Intellectual Property Administration) Search Report for Application No. 201580010177.2, dated Nov. 5, 2018.

*Primary Examiner* — Mohammed Shamsuzzaman
*Assistant Examiner* — Aaron J Gray
(74) *Attorney, Agent, or Firm* — Andrew R. Ralston; Charles A. Brill; Frank D. Cimino (57) ABSTRACT

The Rds*Cgd figure of merit (FOM) of a laterally diffused metal oxide semiconductor (LDMOS) transistor is improved by forming the drain drift region with a number of dopant implants at a number of depths, and forming a step-shaped back gate region with a number of dopant implants at a number of depths to adjoin the drain drift region.

21 Claims, 8 Drawing Sheets

(56) References Cited

U.S. PATENT DOCUMENTS

| | | |
|---|---|---|
| 2008/0258215 A1 | 10/2008 | Tomblad et al. |
| 2010/0244128 A1* | 9/2010 | Bulucea ............ H01L 21/26513 257/335 |
| 2011/0014766 A1 | 1/2011 | Hebert |
| 2011/0215402 A1 | 9/2011 | Lee |
| 2012/0299093 A1* | 11/2012 | Kim ........................ H01L 29/00 257/335 |
| 2013/0207186 A1 | 8/2013 | Cai |

* cited by examiner

LDMOS TRANSISTOR AND METHOD OF FORMING THE LDMOS TRANSISTOR WITH IMPROVED RDS*CGD

CROSS REFERENCE TO RELATED APPLICATIONS

Under 35 U.S.C. §§ 120, 119(e), this continuation application claims benefits of and priority to U.S. patent application Ser. No. 14/556,185, filed on Nov. 30, 2014, which claims benefits of and priority to Provisional Application No. 61/948,853 filed on Mar. 6, 2014. The entirety of the above referenced applications is hereby incorporated by reference herein.

BACKGROUND OF THE INVENTION

1. Field of the Invention

The present invention relates to LDMOS transistors and, more particularly, to a LDMOS transistor and a method of forming the LDMOS transistor with improved Rds*Cgd.

2. Description of the Related Art

A metal oxide semiconductor (MOS) transistor is a well-known semiconductor device that has a source, a drain, a body which has a channel region that lies between and touches the source and drain, and a gate that lies over and is isolated from the channel region by a gate dielectric layer. There are two types of MOS transistors: an NMOS transistor that has n+ source and drain regions with a p-type channel region, and a PMOS transistor that has p+ source and drain regions with an n-type channel region.

In operation, when the source and the body are grounded, a positive voltage is placed on the drain to set up a drain-to-source electric field, and a voltage is placed on the gate that is greater than a threshold voltage, a current flows from the drain to the source. When the voltage placed on the gate is less than the threshold voltage, such as when the gate is pulled down to ground, no current flows.

Current-generation MOS transistors are commonly used in low-voltage environments that range from, for example, 1.2V to 5V. In contrast, a high-voltage MOS transistor is a transistor that operates with voltages in the range of, for example, 10V to 400V. In order to handle the higher voltages, high-voltage MOS transistors are bigger than low-voltage MOS transistors.

One type of high-voltage MOS transistor is known as a laterally diffused MOS (LDMOS) transistor. LDMOS transistors are MOS transistors that also have a drain drift region. The drain drift region, which touches and lies between the drain and the channel region, has the same conductivity type as the drain, but a lower dopant concentration than the drain. In operation, the drain drift region reduces the magnitude of the drain-to-source electric field.

A new figure of merit (FOM) for high current (e.g., 10 Å and above) and high frequency (1-10 MHz and higher) LDMOS transistors is Rds*Cgd, which is the product of the drain-to-source resistance (Rds) and the gate-to-drain capacitance (Cgd). To improve this FOM, it is desirable to reduce the Rds value, the Cgd value, or both of the values.

One approach to reducing Cgd is to use split or step gates in lieu of one gate. With step or split gates, a main gate and, for example, two progressively thinner gates are used so that the closer a gate lies to the drain region the thicker the underlying gate dielectric layer. One drawback to this approach, however, is that split or step gates are difficult and expensive to fabricate. In addition, split or step gates can require longer drain drift regions, which limit the device in high-speed mobile applications due to an increased Rds.

SUMMARY OF THE INVENTION

The present invention is a LDMOS transistor that provides improved Rds*Cgd. The LDMOS transistor includes a semiconductor material, and a drain drift region that lies within the semiconductor material. The drain drift region has a first conductivity type, a first horizontal dopant concentration peak at a first depth and a second horizontal dopant concentration peak at a second depth. The first depth is measured a distance down from a top surface of the semiconductor material. The second depth is measured a distance down from the first depth. The LDMOS transistor also includes a back gate region that lies within the semiconductor material to touch the drain drift region. The back gate region has a second conductivity type, a third horizontal dopant concentration peak at a third depth, a fourth horizontal dopant concentration peak at a fourth depth, and a fifth horizontal dopant concentration peak at a fifth depth. The third depth is measured a distance down from the top surface of the semiconductor material. The fourth depth is measured a distance down from the third depth. The fifth depth is measured a distance down from the fourth depth. The LDMOS transistor additionally includes a gate dielectric layer that touches the top surface of the semiconductor material, and a gate that touches and lies over the gate dielectric layer directly over the drain drift region and the back gate region.

The present invention also includes a method of forming a LDMOS transistor that provides improved Rds*Cgd. The method includes forming a drain drift region within a semiconductor material. The drain drift region has a first conductivity type, a first horizontal dopant concentration peak at a first depth and a second horizontal dopant concentration peak at a second depth. The first depth is measured a distance down from a top surface of the semiconductor material. The second depth is measured a distance down from the first depth. The method also includes forming a back gate region within the semiconductor material to touch the drain drift region. The back gate region has a second conductivity type, a third horizontal dopant concentration peak at a third depth, a fourth horizontal dopant concentration peak at a fourth depth, and a fifth horizontal dopant concentration peak at a fifth depth. The third depth is measured a distance down from the top surface of the semiconductor material. The fourth depth is measured a distance down from the third depth. The fifth depth is measured a distance down from the fourth depth. The method further includes forming a gate dielectric layer that touches the top surface of the semiconductor material, and forming a gate that touches and lies over the gate dielectric layer directly over the drain drift region and the back gate region.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
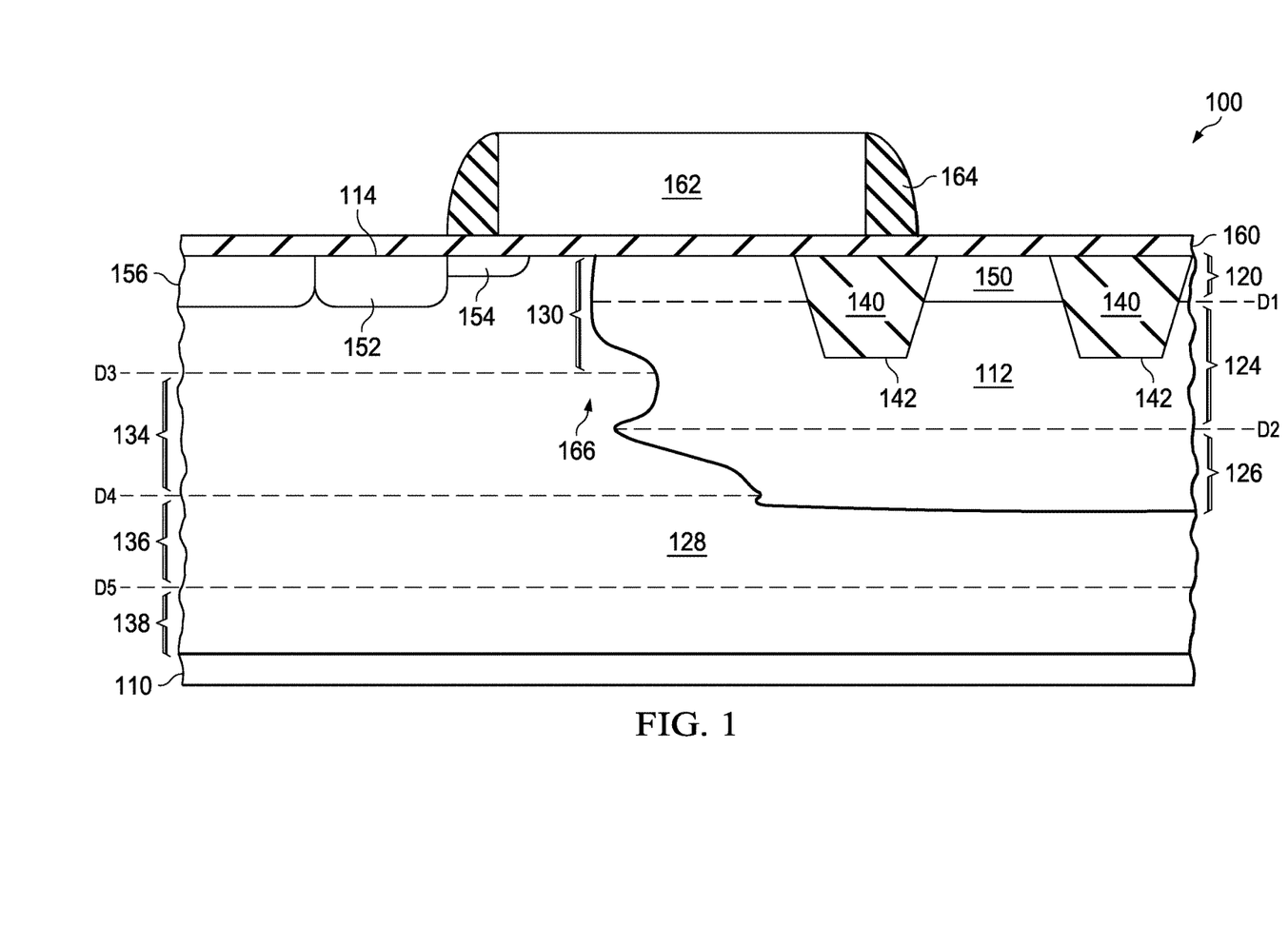
FIG. 1 is a cross-sectional view illustrating an example of a LDMOS transistor 100 in accordance with the present invention.

FIG. 1 shows a cross-sectional view that illustrates an example of a LDMOS transistor 100 in accordance with the present invention. As described in greater detail below, LDMOS transistor 100 improves the Rds*Cgd by utilizing multiple implants in both the drain drift region and an adjoining step-shaped back gate region.

As shown in FIG. 1, LDMOS transistor 100 includes a semiconductor material 110, such as a substrate or an epitaxial layer, and a drain drift region 112 that lies within semiconductor material 110. Drain drift region 112 has a first conductivity type and two horizontal dopant concentration peaks: a first peak at a depth D1 measured a distance down from a top surface 114 of semiconductor material 110, and a second peak at a depth D2 measured a distance down from the depth D1. In the present example, drain drift region 112 has an n conductivity type.

The depth D1 defines a drift top section 120 that extends from the top surface 114 of semiconductor material 110 down to the depth D1. Drift top section 120 has a dopant concentration profile where the dopant concentration increases with increasing depth. In the present example, drift top section 120 continuously increases from a low dopant concentration at the top surface 114 of semiconductor material 110 to a high dopant concentration at the depth D1. Further, the largest dopant concentration within drift top section 120 is at the depth D1.

The depth D1 and the depth D2 define a drift middle section 124 that extends from the depth D1 down to the depth D2. Drift middle section 124 has a dopant concentration profile where the dopant concentration first decreases with increasing depth, and then increases with increasing depth.

In the present example, drift middle section 124 continuously decreases from a high dopant concentration at depth D1 to a lower dopant concentration at a point between the depths D1 and D2, and then continuously increases to a higher dopant concentration at depth D2. Further, the two largest dopant concentrations within drift middle section 124 are at the depths D1 and D2.

The depth D2 also defines a drift bottom section 126 that extends down a distance from the depth D2. Drift bottom section 126 has a dopant concentration profile where the dopant concentration decreases with increasing depth from the depth D2. In the present example, drift bottom section 126 continuously decreases from a high dopant concentration at depth D2 to a lower dopant concentration. Further, the largest dopant concentration within drift bottom section 126 is at the depth D2.

As further shown in FIG. 1, LDMOS transistor 100 also includes a back gate region 128 that lies within semiconductor material 110 to touch drain drift region 112. Back gate region 128 has a second conductivity type, and a step shape that corresponds with three horizontal dopant concentration peaks of the same conductivity type: a peak at a depth D3 measured a distance down from the top surface 114 of semiconductor material 110, a peak at a depth D4 measured a distance down from the depth D3, and a peak at a depth D5 measured a distance down from the depth D4. In the present example, back gate region 128 has a p conductivity type.

The depth D3 defines a back gate top section 130 that extends from the top surface 114 of semiconductor material 110 down to the depth D3. Back gate top section 130 has a dopant concentration profile where the dopant concentration increases with increasing depth. In the present example, back gate top section 130 continuously increases from a low dopant concentration at the top surface 114 of semiconductor material 110 to a high dopant concentration at the depth D3. Further, the largest dopant concentration within back gate top section 130 is at the depth D3.

The depths D3 and D4 also define a back gate middle section 134 that extends from the depth D3 down to the depth D4. Back gate middle section 134 has a dopant concentration profile where the dopant concentration first decreases with increasing depth, and then increases with increasing depth.

In the present example, back gate middle section 134 continuously decreases from a high dopant concentration at depth D3 to a lower dopant concentration at a point between the depths D3 and D4, and then continuously increases to a higher dopant concentration at depth D4. Further, the two largest dopant concentrations within back gate middle section 134 are at the depths D3 and D4.

The depth D4 and the depth D5 define a back gate middle section 136 that extends from the depth D4 down to the depth D5. Back gate middle section 136 has a dopant concentration profile where the dopant concentration first decreases with increasing depth, and then increases with increasing depth.

In the present example, back gate middle section 136 continuously decreases from a high dopant concentration at depth D4 to a lower dopant concentration at a point between the depths D4 and D5, and then continuously increases to a higher dopant concentration at depth D5. Further, the two largest dopant concentrations within back gate middle section 136 are at the depths D4 and D5.

The depth D5 further defines a back gate bottom section 138 that extends down a distance from the depth D5. Back gate bottom section 138 has a dopant concentration profile where the dopant concentration decreases with increasing depth from depth D5. In the present example, back gate bottom section 138 continuously decreases from a high dopant concentration at depth D5 to a lower dopant concentration. As illustrated, the depth D3 lies between the depth D1 and the depth D2. In addition, the depth D4 lies below the depth D2. Further, a portion of back gate middle section 136 and back gate bottom section 138 of back gate region 128 lies directly below drain drift region 112.

As additionally shown in FIG. 1, LDMOS transistor 100 includes a pair of shallow trench isolation (STI) regions 140 that lie within semiconductor material 110. The STI regions 140 have a lower surface 142 that lies below the depth D1. In the present example, the STI regions 140 also have a top surface that lies substantially in the same plane as the top surface 114 of semiconductor material 110.

LDMOS transistor 100 further includes a drain region 150, a source region 152, and a surface region 154 that each lie within semiconductor material 110. Drain region 150, which has the first conductivity type, lies between the STI regions 140 to touch drain drift region 112. Drain region 150 has a dopant concentration substantially greater than a highest dopant concentration of drain drift region 112. In the present example, drain region 150 is implemented as an n+ region.

Source region 152, which also has the first conductivity type, touches back gate region 128. Source region 152 has a dopant concentration substantially equal to the dopant concentration of drain region 150. In the present example, source region 152 is implemented as an n+ region.

Surface region 154, which further has the first conductivity type, touches the top surface 114 of semiconductor material 110, back gate region 128, and source region 152, and lies directly above a portion of back gate region 128. Surface region 154 has a dopant concentration substantially greater than a highest dopant concentration of drain drift region 112. In the present example, surface region 154 is implemented as an n+ region. (Surface region 154 can optionally be omitted.)

LDMOS transistor 100 additionally includes a body contact region 156 that lies within semiconductor material 110 to touch back gate region 128. Body contact region 156 has the second conductivity type, and a dopant concentration substantially greater than a highest dopant concentration of back gate region 128. In the present example, body contact region 156 is implemented as a p+ region.

As also shown in FIG. 1, LDMOS transistor 100 includes a gate dielectric layer 160 that touches the top surface 114 of semiconductor material 110, a gate 162 that touches and lies over gate dielectric layer 160, and sidewall spacers 164 that touch and laterally surround gate 162. Back gate region 128 includes a channel region 166 that lies between and touches drain drift region 112 and source region 152. Gate 162, in turn, lies directly over drain drift region 112 and the channel region 166 of back gate region 128.

In operation, when source region 152 and body contact region 156 are grounded, a positive voltage, such as 16V, is placed on drain region 150 to set up a drain-to-source electric field, and a voltage is placed on gate 162 that is greater than a threshold voltage, a current flows from drain region 150 to source region 152. When the voltage placed on gate 162 is less than the threshold voltage, such as when gate 162 is pulled down to ground, no current flows.

One of the advantages of the present invention is that the region of drift top section 120 at and immediately below the top surface 114 of semiconductor material 110 has a light dopant concentration that increases with depth. By utilizing a region of light dopant concentration at and near the top surface 114 of semiconductor material 110, the gate-to-drain capacitance Cgd can be reduced which, in turn, improves the Rds*Cgd. Another advantage of the present invention is that the higher dopant concentrations at the depths D1 and D2 reduce the drain-to-source resistance Rds, which further improves the Rds*Cgd.

In addition, drain drift region 112 continues to reduce the magnitude of the drain-to-source electric field due to the presence of the lower dopant concentration regions within drift top section 120 and drift middle section 124. The drain-to-source resistance Rds to the drain-to-source breakdown voltage (BV) is best traded off by also utilizing the interaction between drift bottom section 126 and back gate middle section 136 to balance the charge at the horizontal region of high dopant concentration at the depth D2.

A further advantage of the present invention is that the horizontal region of high dopant concentration at the depth D1 that lies below gate 162 is relatively large which, in turn, reduces the channel resistance and the JFET resistance. The JFET resistance is the resistance associated with a subsurface region adjacent to the channel 166 where the width of the depletion region varies with the voltages on drain 150 and gate 162.

In addition, the surface at the horizontal regions of high dopant concentration at the depths D1 and D2 are easily depleted for a reduced Cgd. Further, at increased drain voltage, the step shape area of the horizontal regions of high dopant concentrations at the depths D3 and D4 can screen the increasing electric field at the horizontal regions of high dopant concentration at the depths D1 and D2 that lie below gate 162. This phenomenon works together with the charge balance between drain drift region 112 and back gate region 128 to increase the device drain-to-source breakdown voltage, or, at a targeted device drain-to-source breakdown voltage, the drain drift region 112 length (drift region underneath the lower surfaces 142 of the STI regions 140) can be reduced for a reduced Rds which, in turn, improves the total Rds*Cgd. Thus, the present invention improves the Rds*Cgd by reducing both the Rds and the Cgd values.

FIGS. 2A-2G show a series of cross-sectional views that illustrate an example of a method 200 of forming a LDMOS transistor structure in accordance with the present invention. Method 200 utilizes a conventionally-formed semiconductor material 210, such as a substrate or an epitaxial layer.

Figure 2A:
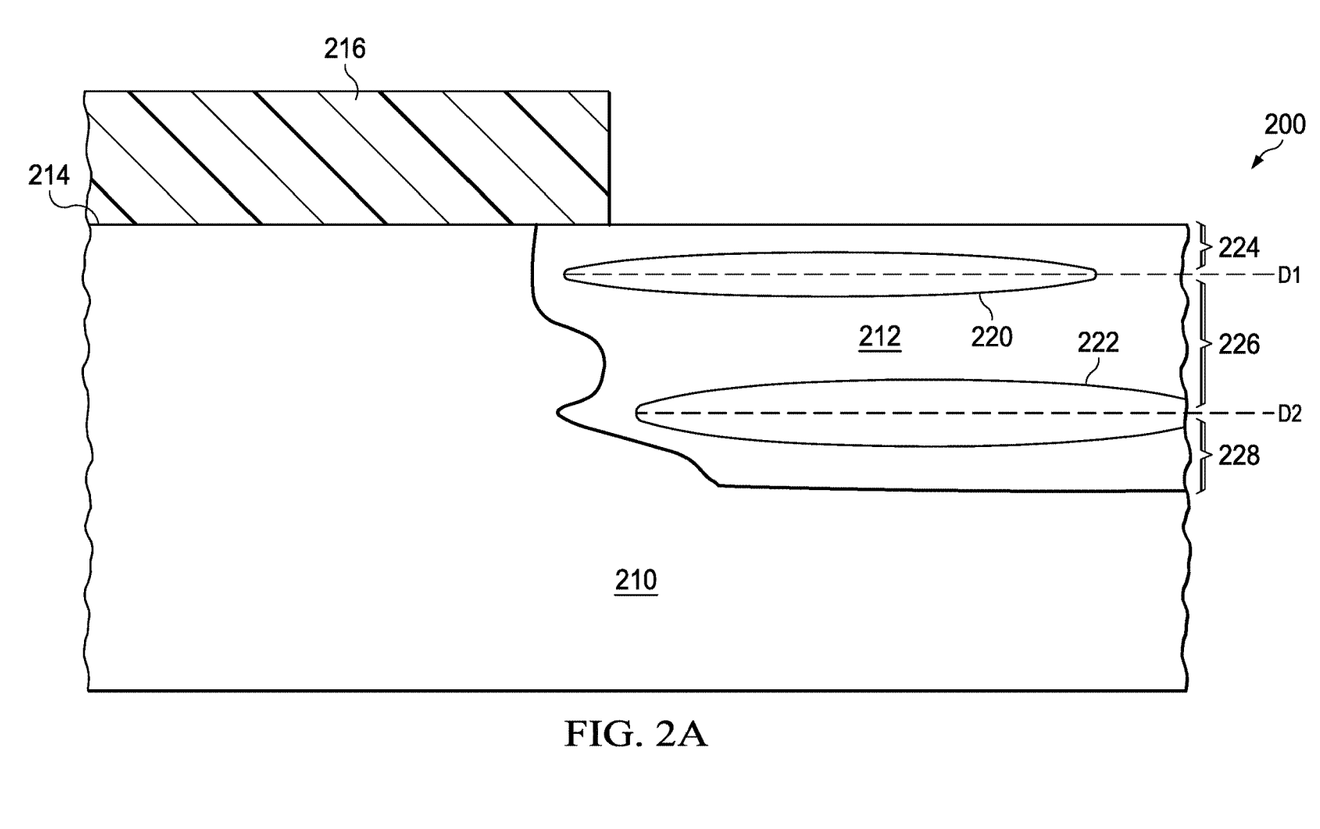
FIGS. 2A-2G are cross-sectional views illustrating an example of a method 200 of forming a LDMOS transistor structure in accordance with the present invention.

Method 200 begins by forming a drain drift region 212 within semiconductor material 210. Drain drift region 212 has a first conductivity type and two horizontal dopant concentration peaks: a first peak at a depth D1 measured down a distance from a top surface 214 of semiconductor material 210, and a second peak at a depth D2 measured down a distance from depth D1. In the present example, drain drift region 212 is formed to have an n conductivity type.

Drain drift region 212 can be formed by first forming a patterned photoresist layer 216 on semiconductor material 210. Patterned photoresist layer 216 is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

After patterned photoresist layer 216 has been formed, dopants are implanted into semiconductor material 210 through patterned photoresist layer 216 to form an upper region 220. Upper region 220 has a horizontal dopant concentration peak at the depth D1. In the present example, arsenic is implanted to form an n-type upper region 220. The arsenic dopants can be implanted with, for example, a dose of $4 \times 10^{12}$ to $8 \times 10^{12}$ and an energy of 200 keV to 350 keV.

With patterned photoresist layer 216 still in place, dopants are again implanted into semiconductor material 210 through patterned photoresist layer 216, this time to form a lower region 222. Lower region 222 has a horizontal dopant concentration peak at the depth D2. In the present example, phosphorous is implanted to form an n-type lower region 222. The phosphorous dopants can be implanted with, for example, a dose of $8 \times 10^{12}$ to $2 \times 10^{13}$ and an energy of 100 keV to 400 keV.

After lower region 222 has been formed, patterned photoresist layer 216 is removed in a conventional manner, such as with an ash process. Following this, a thermal drive process diffuses and activates the dopants to complete the formation of drain drift region 212. The thermal drive process can include a heat treatment of 1100° C. for 90 minutes or equivalent conditions, for example, 1125° C. for 50 minutes, or 1050° C. for 270 minutes.

The depth D1 defines a drift top section 224 that extends from the top surface 214 of semiconductor material 210 down to the depth D1. Portions of drift top section 224 are doped during the thermal drive process, which causes dopants from upper region 220 to out diffuse up into drift top section 224.

Drift top section 224 has a dopant concentration profile where the dopant concentration increases with increasing depth. In the present example, drift top section 224 continuously increases from a low dopant concentration at the top surface 214 of semiconductor material 210 to a high dopant concentration at the depth D1. Further, the largest dopant concentration within drift top section 224 is at the depth D1.

The depth D1 and the depth D2 define a drift middle section 226 that extends from the depth D1 down to the depth D2. Portions of drift middle section 226 are doped during the thermal drive process, which causes dopants from upper region 220 to out diffuse down, and portions of lower region 222 to out diffuse up into drift middle section 226.

Drift middle section 226 has a dopant concentration profile where the dopant concentration first decreases with increasing depth, and then increases with increasing depth. In the present example, drift middle section 226 continuously decreases from a high dopant concentration at depth D1 to a lower dopant concentration at a point between the depths D1 and D2, and then continuously increases to a higher dopant concentration at depth D2. Further, the two largest dopant concentrations within drift middle section 226 are at the depths D1 and D2.

The depth D2 also defines a drift bottom section 228 that extends down a distance from the depth D2. Drift bottom section 228 is doped during the thermal drive process, which causes dopants from lower region 222 to out diffuse down into bottom section 228. (The order in which the upper and lower regions 220 and 222 are formed can alternately be reversed.)

Drift bottom section 228 has a dopant concentration profile where the dopant concentration decreases with increasing depth from depth D2. In the present example, drift bottom section 228 continuously decreases from a high dopant concentration at depth D2 to a lower dopant concentration. Further, the largest dopant concentration within drift bottom section 228 is at the depth D2.

Figure 2B:
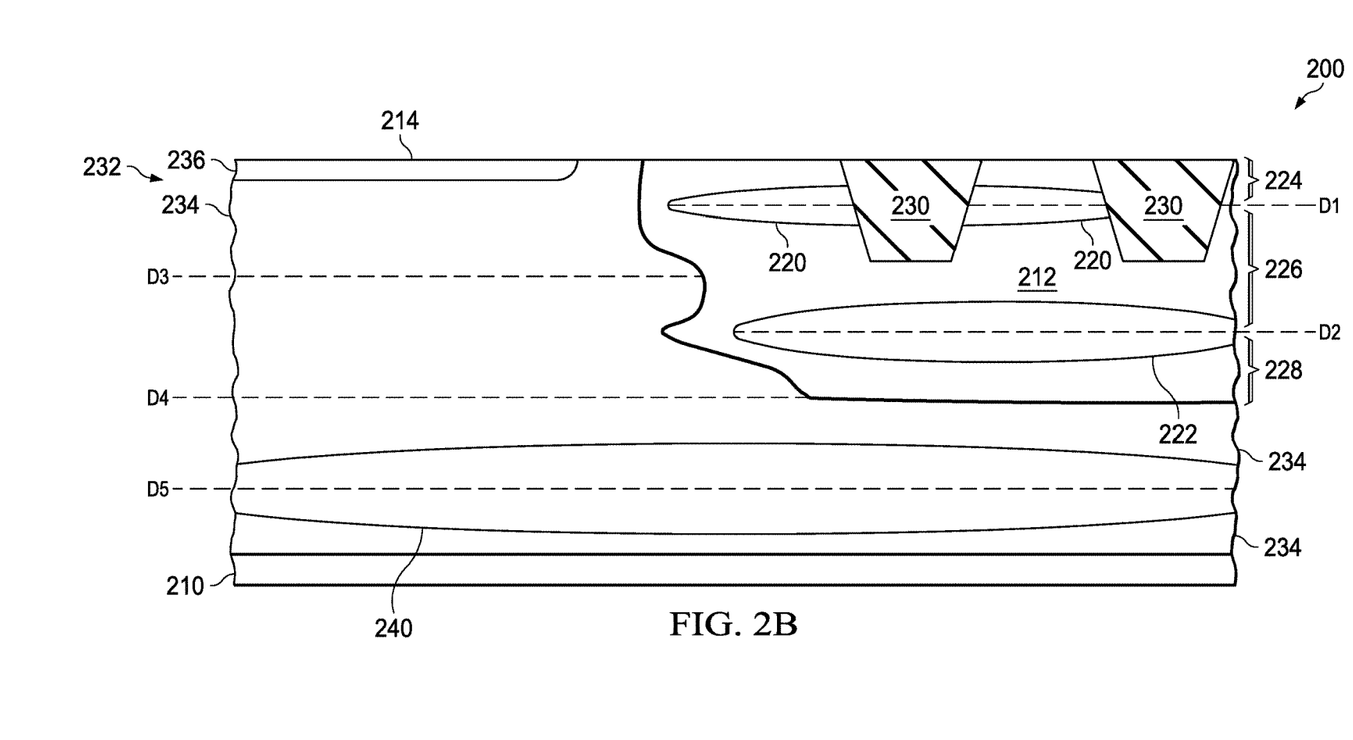

As shown in FIG. 2B, after drain drift region 212 has been formed, a pair of shallow trench isolation (STI) regions 230 is formed in semiconductor material 210 to touch drain drift region 212. The STI regions 230 can be formed in a conventional manner. For example, a hard mask can be formed over semiconductor material 210. After the hard mask has been formed, semiconductor material 210 is etched through the hard mask to form a number of trenches in semiconductor material 210. Next, the hard mask is removed, and a non-conductive material is deposited on the top surface of semiconductor material 210 to fill up the trenches. The non-conductive material on the top surface of semiconductor material 210 is then removed, such as with a chemical-mechanical planarization (CMP) process, to leave the STI regions 230 in the trenches.

As further shown in FIG. 2B, after the STI regions 230 have been formed, a doped region 232 is next formed within semiconductor material 210. The doped region 232 has a back gate region 234 of the second conductivity type, and a surface region 236 of the first conductivity type that touches back gate region 234.

Back gate region 234 is formed to have a step shape that corresponds with three dopant concentration peaks: a peak at a depth D3 down from the top surface of semiconductor material 210, a peak at a lower depth D4, and a peak at a yet lower depth D5. In the present example, back gate region 234 has a p conductivity type, and surface region 236 has a n conductivity type.

Back gate region 234 can be formed by first blanket implanting dopants into semiconductor material 210 to form a buried region 240 that touches and lies below the bottom section 228 of drain drift region 212. Buried region 240 has a dopant concentration peak at the depth D5. In the present example, boron is implanted to form a p-type buried region 234. The boron dopants can be implanted with, for example, a dose of $1\times10^{12}$ to $9\times10^{13}$ and an energy of 400 keV to 900 keV.

Figure 2C:
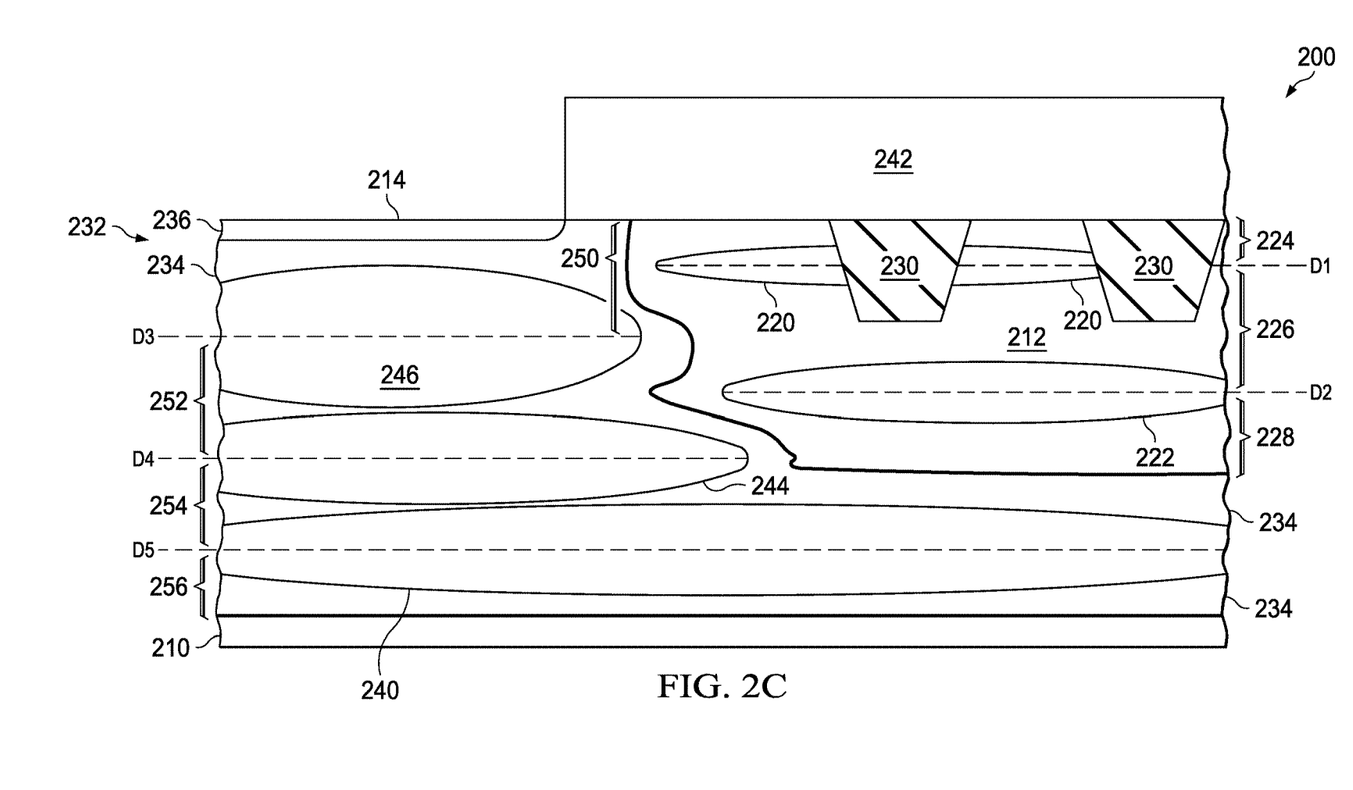

As shown in FIG. 2C, after buried region 240 has been formed, a patterned photoresist layer 242 is conventionally formed on semiconductor material 210. After patterned photoresist layer 242 has been formed, dopants are angle implanted into semiconductor material 210 through patterned photoresist layer 242 to form an intermediate region 244. Intermediate region 244 has a dopant concentration peak at the depth D4. In the present example, boron is implanted to form intermediate region 244. The boron dopants can be implanted with, for example, a dose of $2\times10^{13}$ to $4\times10^{13}$ and an energy of 300 keV to 600 keV.

With patterned photoresist layer 242 still in place, dopants are again implanted into semiconductor material 210 through patterned photoresist layer 242 to form a body region 246. Body region 246 has a dopant concentration peak at the depth D3. In the present example, boron is implanted to form body region 246. The boron dopants can be implanted with, for example, a dose of $5\times10^{13}$ to $3\times10^{14}$ and an energy of 70 keV to 300 keV.

After body region 246 has been formed, dopants are yet again implanted into semiconductor material 210 through patterned photoresist layer 242 to reduce the size of back gate region 234 and form surface region 236. Surface region 236 touches the top surface 214 of semiconductor material 210 and lies above body region 246. In the present example, arsenic is implanted to form surface region 236. The arsenic dopants can be implanted with, for example, a dose of $5\times10^{13}$ to $1\times10^{15}$ and an energy of 30 keV to 160 keV. (The formation of surface region 236 can optionally be omitted.)

After the implant, patterned photoresist layer 242 is removed in a conventional fashion. Following this, a thermal drive process is performed to diffuse and activate the dopants, and complete the formation of doped region 232, back gate region 234, and surface region 236. In the present example, surface region 236 and the immediately surrounding area have an n-type conductivity following the thermal drive, while back gate region 234 has a p-type conductivity following the thermal drive. (The order in which the drain drift region 212 and doped region 232 are formed can alternately be reversed.)

The depth D3 defines a substrate top section 250 that extends from the top surface 114 of semiconductor material 110 down to the depth D3. Substrate top section 250 has a dopant concentration profile below and adjacent to surface region 236 where the dopant concentration increases with increasing depth. In the present example, substrate top section 250 continuously increases from a low dopant concentration below and adjacent to surface region 236 to a high dopant concentration at the depth D3. Further, the largest dopant concentration within substrate top section 250 is at the depth D3.

The depth D3 and the depth D4 define a substrate middle section 252 that extends from the depth D3 down to the depth D4. Substrate middle section 252 has a dopant concentration profile where the dopant concentration first decreases with increasing depth, and then increases with increasing depth.

In the present example, substrate middle section 252 continuously decreases from a high dopant concentration at depth D3 to a lower dopant concentration at a point between the depths D3 and D4, and then continuously increases to a higher dopant concentration at depth D4. Further, the two largest dopant concentrations within substrate middle section 252 are at the depths D3 and D4.

The depth D4 and the depth D5 define a substrate middle section 254 that extends from the depth D4 down to the depth D5. Substrate middle section 254 has a dopant concentration profile where the dopant concentration first decreases with increasing depth, and then increases with increasing depth.

In the present example, substrate middle section 254 continuously decreases from a high dopant concentration at depth D4 to a lower dopant concentration at a point between the depths D4 and D5, and then continuously increases to a higher dopant concentration at depth D5. Further, the two largest dopant concentrations within substrate middle section 254 are at the depths D4 and D5.

The depth D5 also defines a substrate bottom section 256 that extends down a distance from the depth D5. Substrate bottom section 256 has a dopant concentration profile where the dopant concentration decreases with increasing depth from depth D5. In the present example, substrate bottom section 256 decreases from a high dopant concentration at depth D5 to a lower dopant concentration. As illustrated, the depth D3 lies between the depth D1 and the depth D2. In addition, the depth D4 lies below the depth D2. Further, a portion of back gate region 234 of the second (p) conductivity type lies directly below drain drift region 112.

Figure 2D:
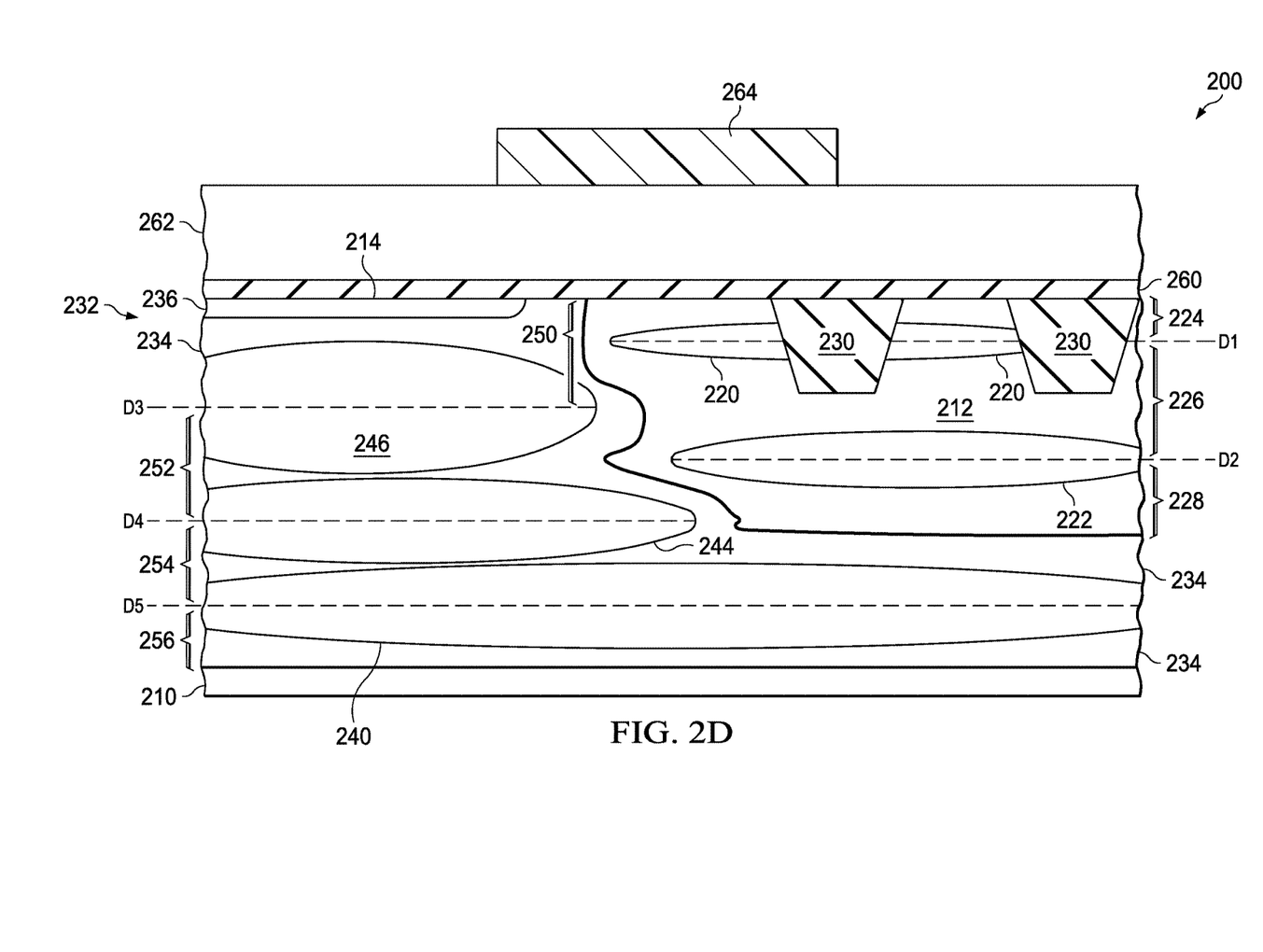

As shown in FIG. 2D, once doped region 232 has been formed, method 200 next forms a gate dielectric layer 260 on the top surface 214 of semiconductor material 210. A cleanup etch of, for example, a wet etch using dilute hydrofluoric acid, can be performed prior to forming gate dielectric layer 260 to remove any unwanted oxide on the top surface of semiconductor material 210.

Gate dielectric layer 260 can be implemented with a thermally grown silicon dioxide, and have a thickness that varies according to the voltages to be used. For example, gate dielectric layer 260 can have 12-15 nm of thermally grown silicon dioxide to support 5V gate operation. Gate dielectric layer 260 can include additional layers of other dielectric material such as silicon oxynitride or hafnium oxide.

Following this, a layer of gate material 262 is deposited on gate dielectric layer 260. The layer of gate material 262 can include 100 to 200 nm of polysilicon and possibly a layer of metal silicide on the polysilicon, such as 100 to 200 nm of tungsten silicide. Other materials which can be used to implement the layer of gate material 262 are within the scope of the instant example. Next, a patterned photoresist layer 264 is conventionally formed over the layer of gate material 262.

Figure 2E:
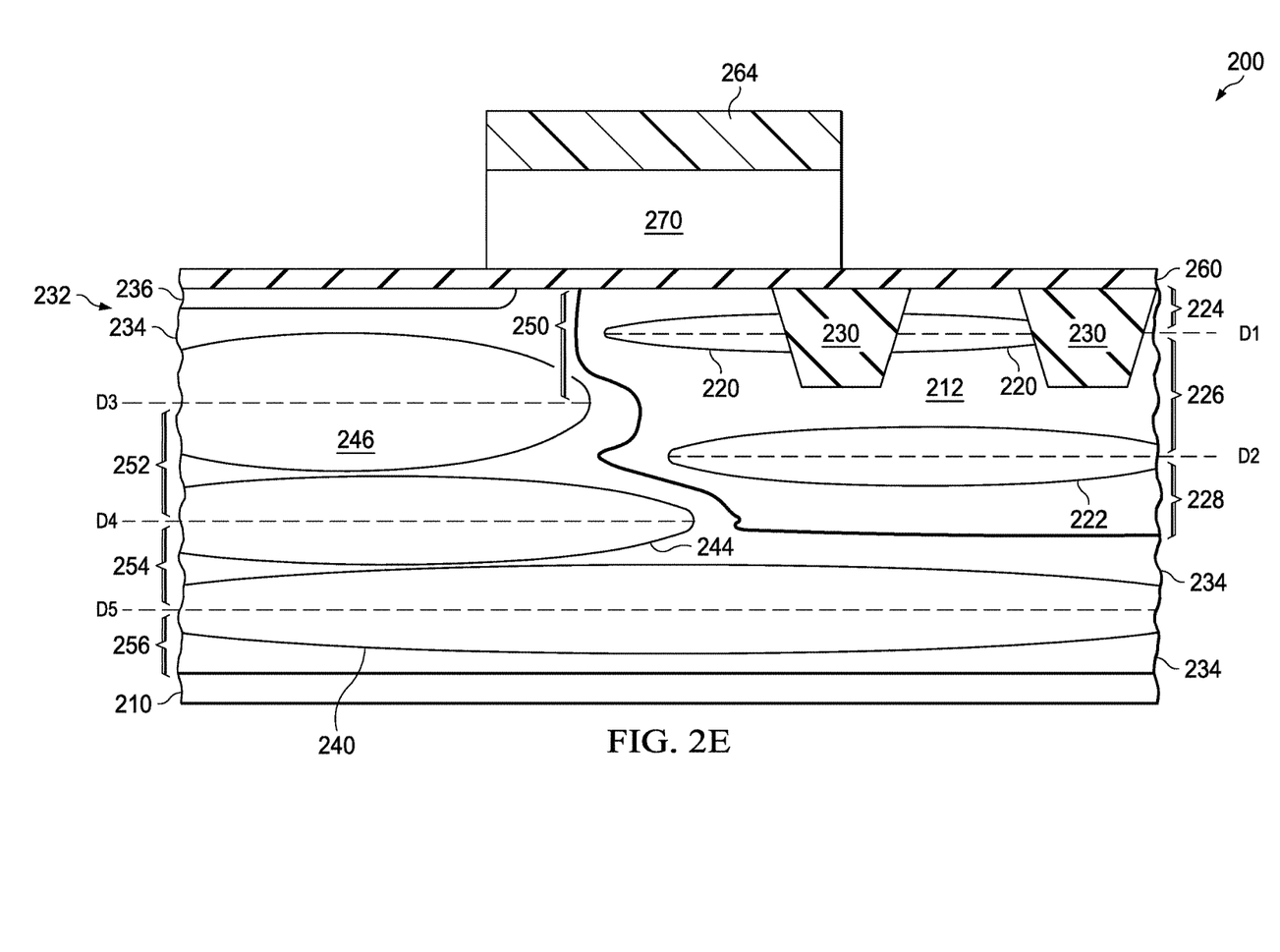

As shown in FIG. 2E, after patterned photoresist layer 264 has been formed, the exposed regions of the layer of gate material 262 are etched in a conventional manner to expose gate dielectric layer 260 and form a gate 270. Following the etch, patterned photoresist layer 264 is removed in a conventional fashion.

Figure 2F:
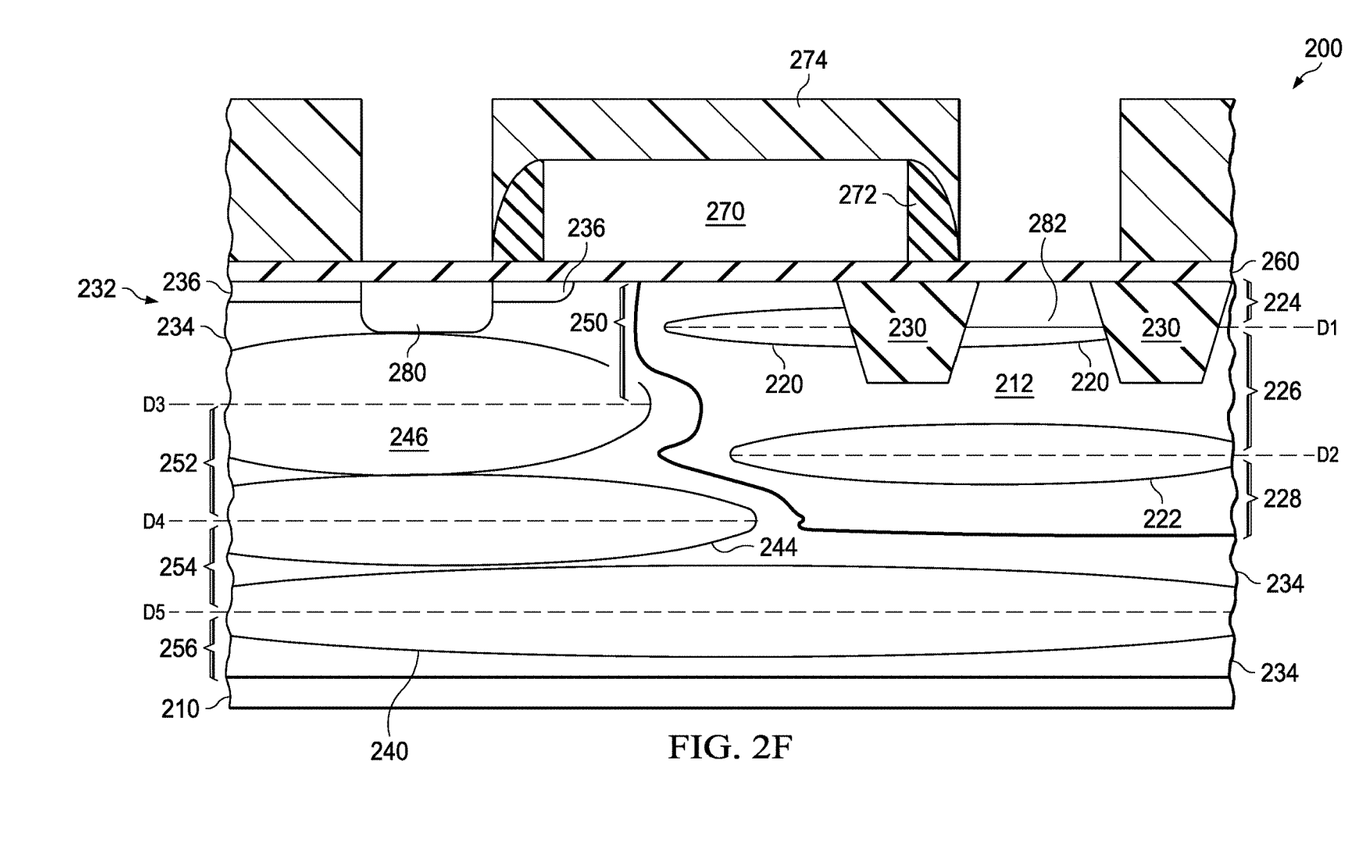

As shown in FIG. 2F, after patterned photoresist layer 264 has been removed, gate sidewall spacers 272 are conventionally formed on the lateral surfaces of the gates 270. The gate sidewall spacers 272 can be formed by forming a conformal layer of silicon dioxide 50 to 150 nm thick over the top surface of the semiconductor device, and then removing the silicon dioxide from horizontal surfaces using an anisotropic etch process, such as a reactive ion etch (RIE) process.

As further shown in FIG. 2F, a patterned photoresist layer 274 is next conventionally formed on gate dielectric layer 260 and gate 270. After this, dopants having the same conductivity type as drain drift region 212 are implanted through patterned photoresist layer 274 to form a source region 280 and a drain region 282. Source region 280 reduces the size of back gate region 234 and surface region 236. Drain region 282 reduces the size of drain drift region 212.

Source region 280, which is heavily doped, touches back gate region 234 and surface region 236. Drain region 282, which is also heavily doped, is formed between the STI regions 230 to touch drain drift region 212. Following the implant, patterned photoresist layer 274 is removed in a conventional manner. In the present example, the source and drain regions 280 and 282 are n+ regions. The implant can have a dose of $8\times10^{14}$ to $1\times10^{16}$ and an energy of 20 keV to 70 keV.

Figure 2G:
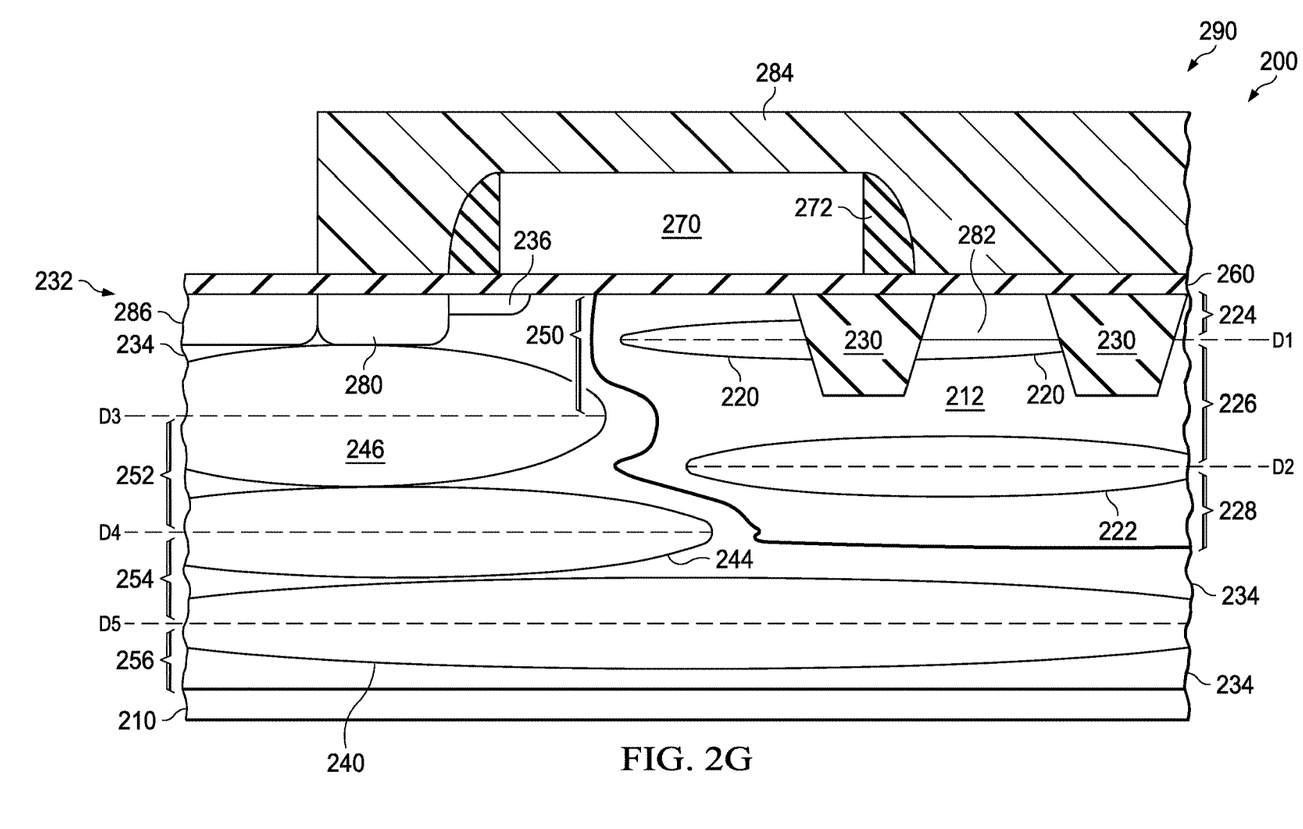

As shown in FIG. 2G, after patterned photoresist layer 274 has been removed, a patterned photoresist layer 284 is next conventionally formed on gate dielectric layer 260 and gate 270. After this, dopants having the same conductivity type as back gate region 234 are implanted through patterned photoresist layer 284 to form a body contact region 286.

Body contact region 286, which is heavily doped, touches body region 246. Following the implant, patterned photoresist layer 284 is removed in a conventional manner to complete the formation of a LDMOS transistor structure 290. In the present example, body contact region 276 is a p+ regions. The implant can have a dose of $8\times10^{14}$ to $1\times10^{16}$ and an energy of 20 keV to 70 keV.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:
1. A transistor, comprising:
a semiconductor substrate having a top surface;
a gate positioned above the top surface;
a first drain drift region positioned near the top surface and extending partially under the gate;
a first back gate region staggering with the first drain drift region under the gate;
a second drain drift region positioned directly under the first drain drift region and staggering with the first back gate region under the gate; and
a second back gate region positioned directly under the first back gate region and the second drain drift region,
a first drain dopant concentration peak (DCP) between the top surface and the first drain drift region, the first drain DCP extending partially under the gate;
a first back gate DCP between the top surface and the first back gate region, the first back gate DCP extending partially under the first drain DCP;
a second drain DCP between the first drain drift region and the second drain drift region, the second drain DCP extending partially under the first backgate DCP;
a second back gate DCP between the first back gate region and the second back gate region, the second back gate DCP extending partially under the second drain DCP; and
a third back gate DCP below the second back gate region, the third back gate DCP extending under and across the second drain DCP.

2. The transistor of claim 1, further comprising: a top drain drift region between the top surface and the first drain drift region; and a top back gate region between the top surface and the first back gate region.

3. The transistor of claim 1, further comprising:
    a source region above the first back gate region and free from overlapping the gate; and
    a surface region adjacent to the source region and partially under the gate, the surface region having a higher doping concentration than the first drain drift region and the second drain drift region.

4. The transistor of claim 1, further comprising:
    a drain region above the first drain drift region and free from overlapping the gate; and
    an isolation structure laterally surrounding the drain region and having a greater depth than the drain region.

5. A transistor, comprising:
    a substrate having a top surface;
    a gate positioned above the top surface;
    a p-doped region in the substrate, the p-doped region including a p-type dopant concentration peak (DCP) extending partially under the gate; and
    an n-doped region in the substrate, the n-doped region including:
        a first n-type DCP extending partially under the gate and partially and immediately above the p-type DCP; and
        a second n-type DCP below the first n-type DCP, the second n-type DCP extending partially and directly under the p-type DCP,
    wherein the p-doped region includes:
        a top back gate section below the top surface and extending partially under the gate, a portion of the n-doped region overlapping a portion of the top back gate section; and
        a middle back gate section interfacing the top back gate section along the p-type DCP, a groove in the middle back gate section being protruded by the second n-type DCP.

6. The transistor of claim 5, wherein the p-doped region includes:
    a second p-type DCP below the p-type DCP, the second p-type DCP extending partially under the second n-type DCP.

7. The transistor of claim 5, wherein the p-doped region includes:
    a second p-type DCP below the p-type DCP, the second p-type DCP extending under and across the second n-type DCP.

8. The transistor of claim 5, further comprising:
    a source region within the p-doped region and above the p-type DCP, the source region does not extend directly under the gate; and
    a surface region adjacent to the source region and partially under the gate, the surface region having a higher doping concentration than the n-doped region.

9. The transistor of claim 5, further comprising:
    a drain region within the n-doped region and above the first n-type DCP, the drain region does not extend under the gate; and
    an isolation structure laterally surrounding the drain region and having a greater depth than the drain region.

10. The transistor of claim 5, wherein the n-doped region includes:
    a top drain drift section below the top surface and extending partially under the gate;
    a middle drain drift section interfacing the top drain drift section along the first n-type DCP, a groove in the middle drain drift section being protruded by the p-type DCP; and
    a bottom drain drift section interfacing the middle drain drift section along the second n-type DCP, a portion of the bottom drain drift section overlapping a portion of the p-doped region.

11. The transistor of claim 5, wherein the n-doped region includes:
    a top drain drift section below the top surface and extending partially under the gate;
    a middle drain drift section interfacing the top drain drift section along the first n-type DCP, a portion of the middle drain drift section overlapping a portion of the p-doped region adjacent the p-type DCP.

12. The transistor of claim 5, wherein the n-doped region includes:
    a top drain drift section below the top surface and extending partially under the gate;
    a middle drain drift section interfacing the top drain drift section along the first n-type DCP, a first portion of the middle drain drift section overlapping a portion of the p-doped region adjacent the p-type DCP and a second portion of the middle drain drift section under lapping a portion of the p-doped region adjacent the p-type DCP.

13. The transistor of claim 5, wherein a portion of the n-doped region adjacent the first n-type DCP overlaps a portion of the p-doped region adjacent a bottom portion of the middle gate section.

14. An integrated circuit, comprising:
    a substrate having a top surface;
    transistors, each including:
        a gate positioned above the top surface;
        a p-doped region in the substrate, the p-doped region including a p-type dopant concentration peak (DCP) extending partially under the gate; and
        an n-doped region in the substrate, the n-doped region including:
            a first n-type DCP extending partially under the gate and partially and immediately above the p-type DCP; and
            a second n-type DCP below the first n-type DCP, the second n-type DCP extending partially and immediately under the p-type DCP,
        wherein the p-doped region includes:
            a top back gate section below the top surface and extending partially under the gate, a portion of the n-doped region overlapping a portion of the top back gate section; and
            a middle back gate section interfacing the top back gate section along the p-type DCP, a groove in the middle back gate section being protruded by the second n-type DCP.

15. The integrated circuit of claim 14, further comprising:
    a source region within the p-doped region and above the p-type DCP, the source region does not extend directly under the gate; and
    a surface region adjacent to the source region and partially under the gate, the surface region having a higher doping concentration than the n-doped region.

16. The integrated circuit of claim 14, further comprising:
    a drain region within the n-doped region and above the first n-type DCP, the drain region does not extend under the gate; and an isolation structure laterally surrounding the drain region and having a greater depth than the drain region.

17. The integrated circuit of claim 14, wherein the n-doped region includes:
   a top drain drift section below the top surface and extending partially under the gate;
   a middle drain drift section interfacing the top drain drift section along the first n-type DCP, a groove in the middle drain drift section being protruded by the p-type DCP; and
   a bottom drain drift section interfacing the middle drain drift section along the second n-type DCP, a portion of the bottom drain drift section overlapping a portion of the p-doped region.

18. The transistor of claim 14, wherein the n-doped region includes:
   a top drain drift section below the top surface and extending partially under the gate;
   a middle drain drift section interfacing the top drain drift section along the first n-type DCP, a portion of the middle drain drift section overlapping a portion of the p-doped region adjacent the p-type DCP.

19. The transistor of claim 14, wherein the n-doped region includes:
   a top drain drift section below the top surface and extending partially under the gate;
   a middle drain drift section interfacing the top drain drift section along the first n-type DCP, a first portion of the middle drain drift section overlapping a portion of the p-doped region adjacent the p-type DCP and a second portion of the middle drain drift section underlapping a portion of the p-doped region adjacent the p-type DCP.

20. The transistor of claim 14, wherein a portion of the n-doped region adjacent the first n-type DCP overlaps a portion of the p-doped region adjacent a bottom portion of the middle gate section.

21. An integrated circuit, comprising:
   a substrate having a top surface; and
   transistors, each including:
      a gate positioned above the top surface;
      a p-doped region in the substrate, the p-doped region including a p-type dopant concentration peak (DCP) extending partially under the gate;
      an n-doped region in the substrate, the n-doped region including:
         a first n-type DCP extending partially under the gate and partially and immediately above the p-type DCP; and
         a second n-type DCP below the first n-type DCP, the second n-type DCP extending partially and immediately under the p-type DCP;
      a second p-type DCP below the p-type DCP, the second p-type DCP extending partially under the second n-type DCP; and
      a third p-type DCP below the second p-type DCP, the third p-type DCP extending under and across the second n-type DCP.

\* \* \* \* \*